(12) United States Patent
Cho et al.

(10) Patent No.: US 8,168,107 B2
(45) Date of Patent: May 1, 2012

(54) METHOD OF FORMING A PATTERN USING NANO IMPRINTING AND METHOD OF MANUFACTURING A MOLD TO FORM SUCH A PATTERN

(75) Inventors: Young Tae Cho, Suwon-si (KR); Young Suk Sim, Suwon-si (KR); Jeong Gil Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 20 days.

(21) Appl. No.: 12/453,978

(22) Filed: May 28, 2009

(65) Prior Publication Data

US 2010/0072675 A1    Mar. 25, 2010

(30) Foreign Application Priority Data

Sep. 19, 2008    (KR) ........................ 10-2008-0092430

(51) Int. Cl.
*B28B 11/08*    (2006.01)
(52) U.S. Cl. ......... 264/293; 264/219; 264/220; 264/496
(58) Field of Classification Search .................. 264/496, 264/293, 219–220
See application file for complete search history.

(56) References Cited

U.S. PATENT DOCUMENTS

| | | | |
|---|---|---|---|
| 6,017,973 A * | 1/2000 | Tamura et al. .................. | 522/96 |
| 6,242,140 B1 * | 6/2001 | Kwon et al. ..................... | 430/7 |
| 7,077,992 B2 * | 7/2006 | Sreenivasan et al. .......... | 264/496 |
| 2004/0038138 A1 * | 2/2004 | Kiguchi et al. .................... | 430/7 |
| 2005/0277034 A1 * | 12/2005 | Mitsui .............................. | 430/5 |
| 2007/0099323 A1 * | 5/2007 | Chang et al. .................... | 438/30 |
| 2007/0145004 A1 * | 6/2007 | Kim ................................. | 216/24 |
| 2008/0038398 A1 * | 2/2008 | Wago et al. .................... | 425/385 |
| 2008/0057604 A1 * | 3/2008 | Tanaka ............................ | 438/29 |
| 2008/0167396 A1 * | 7/2008 | Murao ............................. | 522/67 |

FOREIGN PATENT DOCUMENTS

| | | |
|---|---|---|
| EP | 1460738 A2 * | 9/2004 |
| KR | 10-2007-0102263 | 10/2007 |

\* cited by examiner

*Primary Examiner* — Philip Tucker
*Assistant Examiner* — Amjad Abraham
(74) *Attorney, Agent, or Firm* — Harness, Dickey & Pierce, P.L.C.

(57) ABSTRACT

Example embodiments relate to a method of forming a three-dimensional micro pattern or a multi-step pattern using a nano imprinting process and a method of manufacturing a mold to form such a pattern. A molding polymer may be patterned in a one-step shape on a substrate having UV barrier patterns, thereby easing the manufacture of a mold for multi-step imprinting and simplifying the formation of a multi-step pattern using the one-step shaped mold by avoiding the repetition of more complicated processes. Consequently, it may be possible to form a relatively large-area micro pattern, a relatively large-area pattern usable in flat panel displays, and a nano pattern having a size of several tens of nanometers in a semiconductor process, thereby contributing to the reduction of process costs, the reduction of process time, and the improvement of production yield.

20 Claims, 7 Drawing Sheets

METHOD OF FORMING A PATTERN USING NANO IMPRINTING AND METHOD OF MANUFACTURING A MOLD TO FORM SUCH A PATTERN

CROSS-REFERENCE TO RELATED APPLICATION

This application claims priority under 35 U.S.C. §119 to Korean Patent Application No. 2008-0092430, filed on Sep. 19, 2008 with the Korean Intellectual Property Office, the entire disclosure of which is incorporated herein by reference.

BACKGROUND

1. Field

Example embodiments relate to a method of forming a three-dimensional micro pattern or a multi-step pattern using a nano imprint process and a method of manufacturing a mold to form such a pattern.

2. Description of the Related Art

A nano imprint process to form a pattern having a nano size of about 1 to 100 nm using a mold may be classified as a thermal type process or an ultraviolet (UV) type process. The nano imprint process may be applicable to a plastic substrate (which may require a relatively low-temperature process) and a glass or quartz substrate (which may exhibit no conductivity) as well as a semiconductor substrate (e.g., a silicon (Si) substrate).

The nano imprint process may form a pattern in a simpler manner than a conventional photolithography process. Consequently, the nano imprint process may increase productivity and lower costs. For this reason, it may be beneficial to use the nano imprint process to manufacture semiconductors or flat panel displays.

A mold having a nano size may be employed to form a pattern using the nano imprint process. Glass or quartz may be used to form the mold. However, the conventional technology for forming such a mold may be relatively complicated and difficult, thus involving increased process costs and time. For instance, a multi-step shaped mold for nano imprinting may be necessary to form a relatively complicated three-dimensional micro pattern or a multi-step pattern, but it may be relatively difficult to manufacture the multi-step shaped mold.

SUMMARY

Example embodiments relate to a method of forming a multi-step pattern (three-dimensional pattern) using a one-step shaped mold and a method of manufacturing a mold to form such a pattern. As a result, the manufacture of a multi-step shaped mold may be avoided, thus simplifying the method of forming a multi-step pattern.

A method of forming a pattern according to example embodiments may include patterning a molding polymer on a molding substrate having UV barrier patterns to attain a mold, applying an imprint resin onto a forming substrate, pressing the imprint resin with the mold, curing the pressed imprint resin, and separating the mold from the cured imprint resin.

The imprint resin may be UV-curable. The mold may be coated with an anti-adhesion layer prior to pressing the imprint resin with the mold. The cured imprint resin may have a multi-step pattern. The multi-step pattern may include a three-dimensional micro pattern or a three-dimensional macro pattern. The method may further include washing away uncured imprint resin after separating the mold from the cured imprint resin.

A method of manufacturing a mold according to example embodiments may include patterning a UV barrier layer on a substrate to form UV barrier patterns, and patterning a molding polymer on the UV barrier patterns and the substrate to attain the mold.

Patterning the UV barrier layer may include depositing the UV barrier layer on the substrate, applying a resist layer onto the UV barrier layer and forming a resist pattern, and etching the UV barrier layer using the resist pattern as a mask.

Patterning the molding polymer may include applying the molding polymer onto the substrate having UV barrier patterns, and patterning the molding polymer with an imprint process. Alternatively, patterning the molding polymer may include applying the molding polymer onto the substrate having UV barrier patterns, and patterning the molding polymer with an exposure process. The molding polymer may be UV-curable or heat-curable.

BRIEF DESCRIPTION OF THE DRAWINGS

The above and other aspects of example embodiments may become more apparent and readily appreciated when the following detailed description is taken in conjunction with the accompanying drawings, of which.

DETAILED DESCRIPTION

Figure 1A:
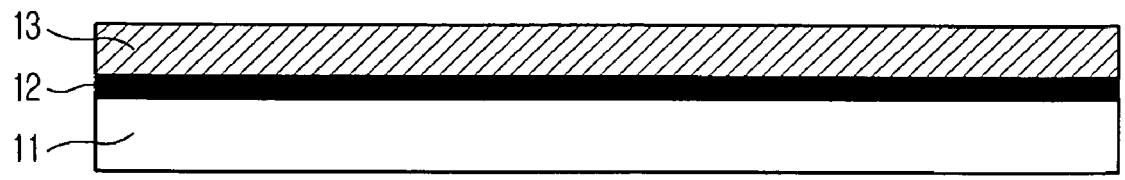
FIGS. 1A to 1G are cross-sectional views illustrating a method of manufacturing a mold for forming a multi-step pattern via nano imprinting according to example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIGS. 1A to 1G are cross-sectional views illustrating a method of manufacturing a mold for forming a multi-step pattern via nano imprinting according to example embodiments.

In FIG. 1A, an ultraviolet (UV) barrier layer 12 may be deposited on a first molding substrate 11. The UV barrier layer 12 may facilitate the blocking of UV rays and may be formed of chromium (Cr). A resist layer 13 (e.g., for photolithography) may be applied onto the UV barrier layer 12. The first substrate 11 may be formed of a material through which UV rays may be transmitted (e.g., glass or quartz).

Figure 1B:
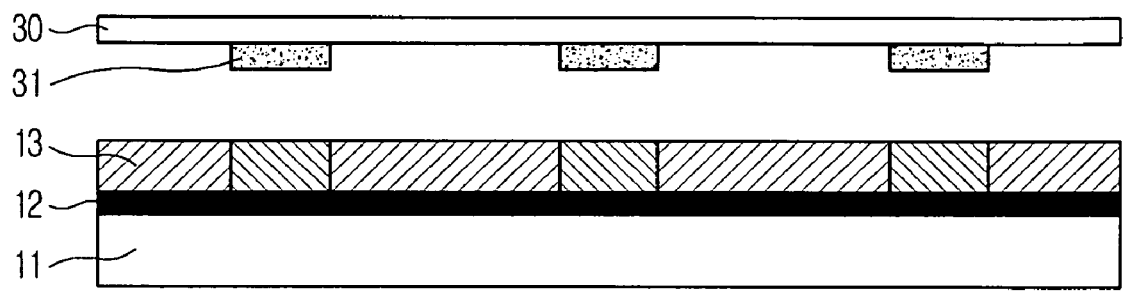

In FIG. 1B, a first mask 30 for photolithography may be used to pattern the resist layer 13. A photosensitive emulsion or a metal film may be formed on a major surface of the first mask 30 in a predetermined pattern. For instance, the first mask 30 may have opaque films 31 on its lower surface. The opaque films 31 adjoined to the first mask 30 may be achieved by applying an opaque layer on a mask substrate, applying a photosensitive film on the opaque layer, and patterning the opaque layer using an e-beam or laser to form the opaque films 31. The opaque films 31 may be made of chromium (Cr), although other suitable materials may be used.

Figure 1C:
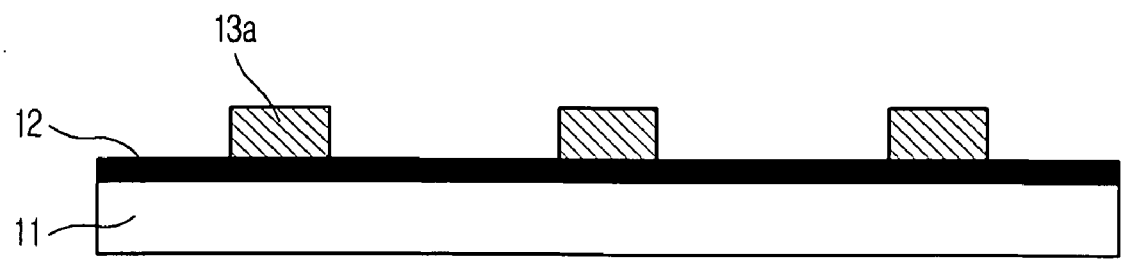

In FIG. 1C, the resist layer 13 may be exposed and developed via photolithography using the first mask 30 to form resist patterns 13a.

Figure 1D:

In FIG. 1D, the UV barrier layer 12 may be etched using the resist patterns 13a as etching masks to form UV barrier patterns 12a.

Figure 1E:
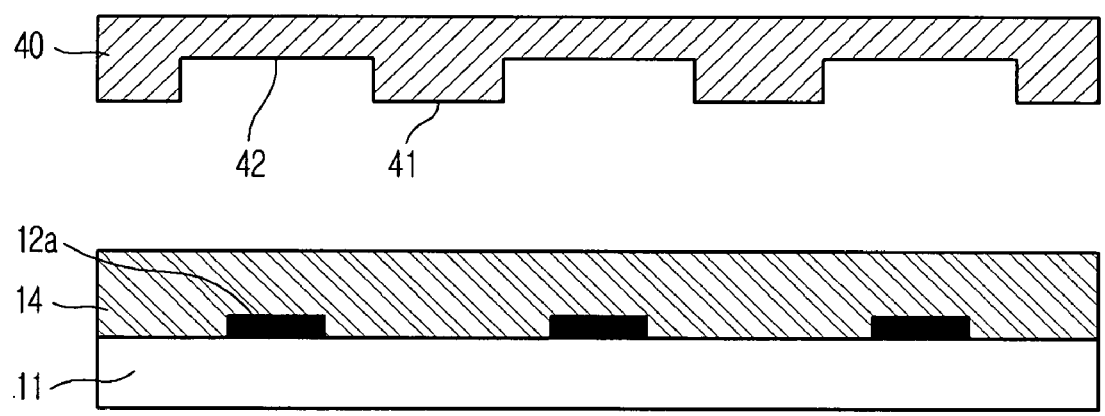

In FIG. 1E, a molding polymer 14 may be coated on the first substrate 11 and the UV barrier patterns 12a. A UV-curable polymer resin may be used as the molding polymer 14. A stamp 40 may also be prepared so as to have a pattern defined by alternately arranged embossed parts 41 and engraved parts 42.

Figure 1F:
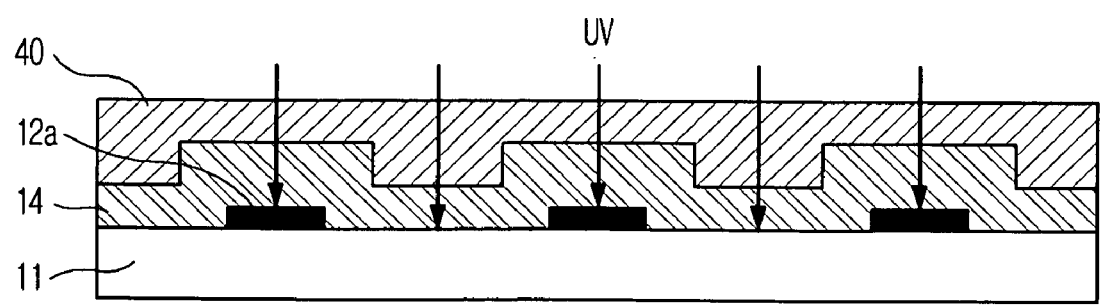

In FIG. 1F, the molding polymer 14 may be pressed using the stamp 40 and subjected to UV irradiation. As a result, the molding polymer 14 is cured by the UV rays.

Figure 1G:
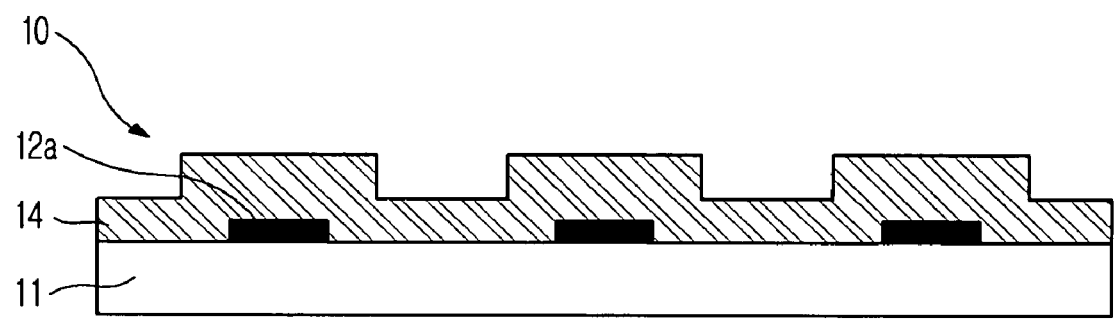

In FIG. 1G, the stamp 40 is separated from the molding polymer 14 to obtain a one-step shaped first mold 10 for use in a multi-step imprint process.

FIGS. 2A to 2G are cross-sectional views illustrating another method of manufacturing a mold for forming a multi-step pattern via nano imprinting according to example embodiments.

Figure 2A:
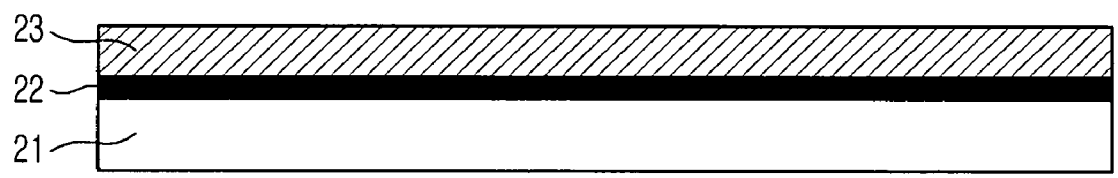
FIGS. 2A to 2G are cross-sectional views illustrating another method of manufacturing a mold for forming a multi-step pattern via nano imprinting according to example embodiments.

In FIG. 2A, a UV barrier layer 22 may be deposited on a second molding substrate 21. The UV barrier layer 22 may facilitate the blocking of UV rays and may be formed of chromium (Cr). A resist layer 23 (e.g., for photolithography) may be applied onto the UV barrier layer 22. Like the first molding substrate 11 of FIGS. 1A-1G, the second molding substrate 21 may be made of a material through which UV rays may be transmitted (e.g., glass or quartz).

Figure 2B:
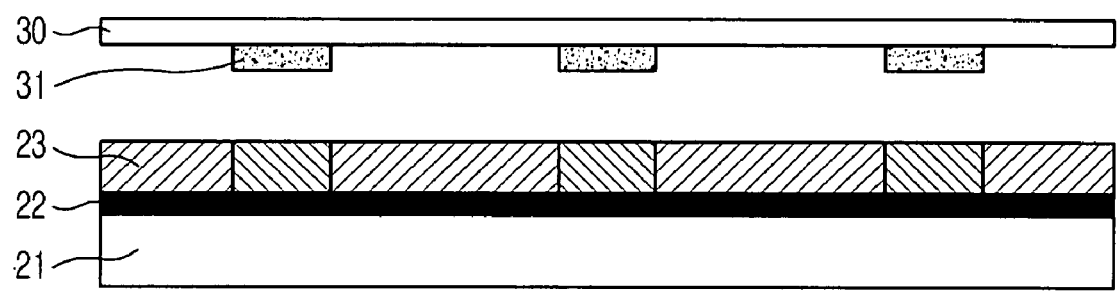

In FIG. 2B, a first mask 30 for photolithography may be used to pattern the resist layer 23. The first mask 30 in FIG. 2B may be identical to the first mask 30 in FIG. 1B. Therefore, a detailed description thereof will not be given in view of the previous discussion with regard to FIG. 1B.

Figure 2C:
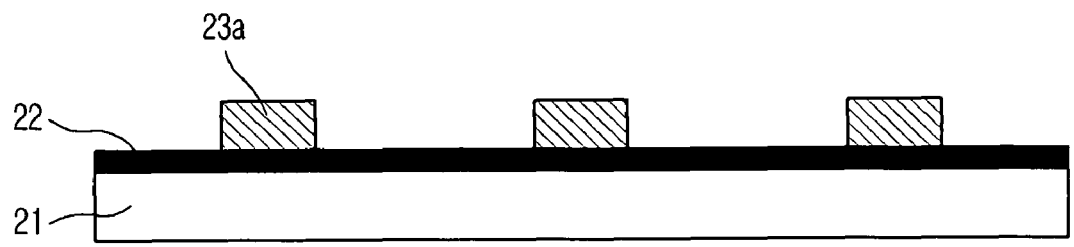

In FIG. 2C, the resist layer 23 may be exposed and developed via photolithography using the first mask 30 to form resist patterns 23a.

Figure 2D:
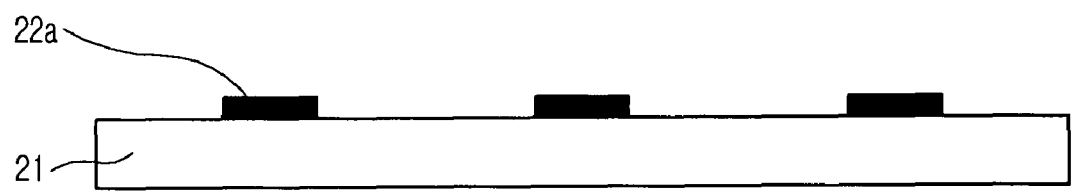

In FIG. 2D, the UV barrier layer 22 may be etched using the resist patterns 23a as etching masks to form UV barrier patterns 22a.

Figure 2E:
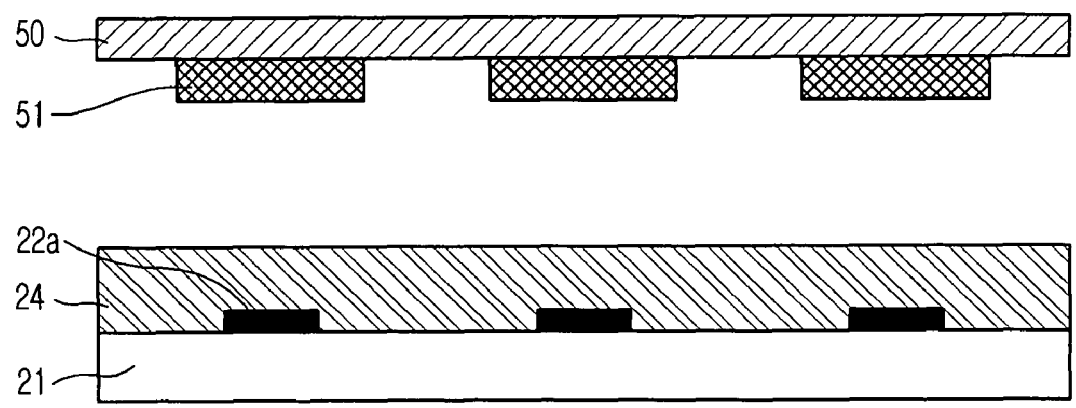

In FIG. 2E, a molding polymer 24 may be coated on the second substrate 21 and the UV barrier patterns 22a. A heat-curable positive photoresist may be used as the molding polymer 24. A second mask 50 for photolithography may be used to pattern the molding polymer 24. Like the first mask 30, a photosensitive emulsion or a metal film may be formed on a major surface of the second mask 50 in a predetermined pattern. For instance, the second mask 50 may have opaque films 51 on its lower surface. The opaque films 51 adjoined to the second mask 50 may be achieved by applying an opaque layer on a mask substrate, applying a photosensitive film on the opaque layer, and patterning the opaque layer using an e-beam or laser to form the opaque films 51. The opaque films 51 may be made of chromium (Cr), although other suitable materials may be used. The second mask 50 may have a pattern identical to or different from that of the first mask 30.

Figure 2F:
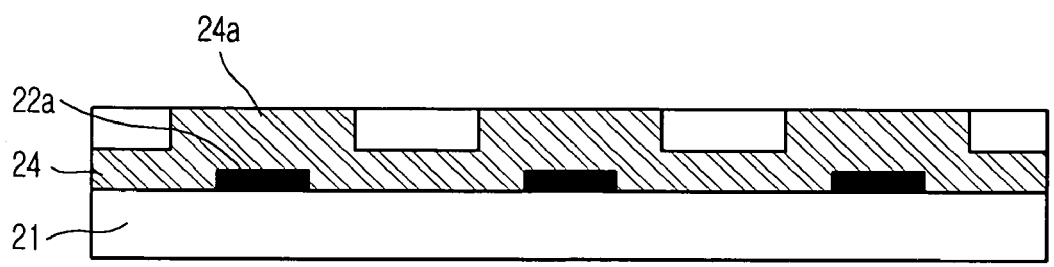

In FIG. 2F, the molding polymer 24 may be exposed and developed via photolithography using the second mask 50 to form molding polymer patterns 24a.

Figure 2G:
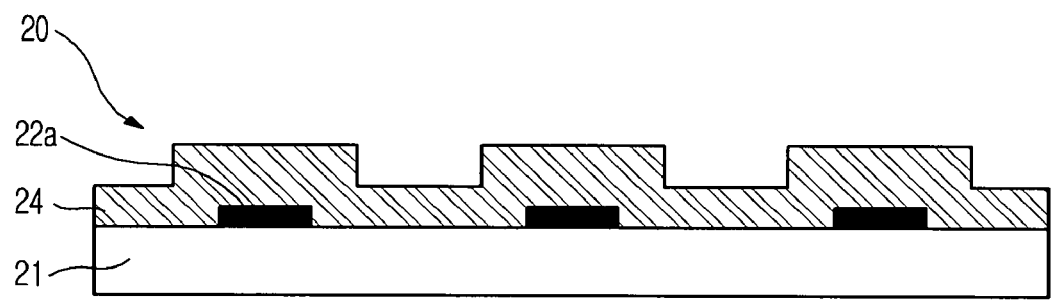

In FIG. 2G, the exposed portions of the molding polymer 24 may be etched to obtain a one-step shaped second mold 20 for use in a multi-step imprint process.

FIGS. 3A to 3D are perspective views illustrating a method of forming a multi-step pattern via nano imprinting with a mold according to example embodiments.

Figure 3A:
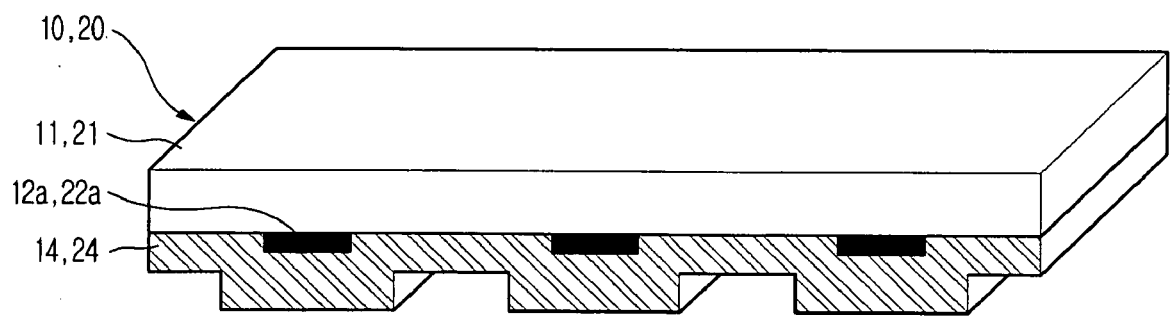
FIGS. 3A to 3D are perspective views illustrating a method of forming a multi-step pattern via nano imprinting with a mold according to example embodiments.

In FIG. 3A, a one-step shaped first mold 10 (manufactured according to FIGS. 1A to 1G) or a one-step shaped second mold 20 (manufactured according to FIGS. 2A to 2G) may be prepared.

Figure 3B:
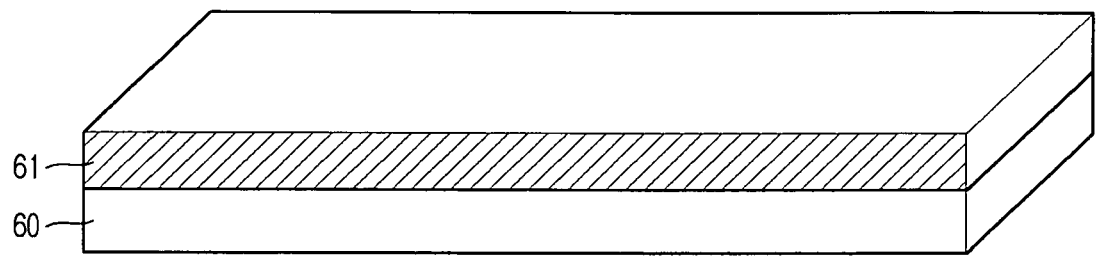

In FIG. 3B, a UV-curable imprint resin 61 may be applied to a forming substrate 60. The forming substrate 60 may be made of a material that is conducive to performing a UV nano imprint process. For instance, a flat substrate made of glass, quartz, or metal through which UV rays may be transmitted or a flexible substrate made of polyethylene terephthalate (PET) or polyethylene naphthalate (PEN) may be used as the forming substrate 60. Like the molding polymer 14 of the first mold 10, a UV-curable polymer resin may be used as the imprint resin 61. The molding polymer 14 of the first mold 10 and the imprint resin 61 may be made of different materials to reduce or prevent the adhesion between the molding polymer 14 of the first mold 10 and the imprint resin 61 in a subsequent pressing step. Alternatively, when the molding polymer 14 of the first mold 10 and the imprint resin 61 are made of the same material, the molding polymer 14 of the first mold 10 may be coated with an anti-adhesion layer to ease the separation of the molding polymer 14 of the first mold 10 from the imprint resin 61 after the subsequent pressing step.

Figure 3C:
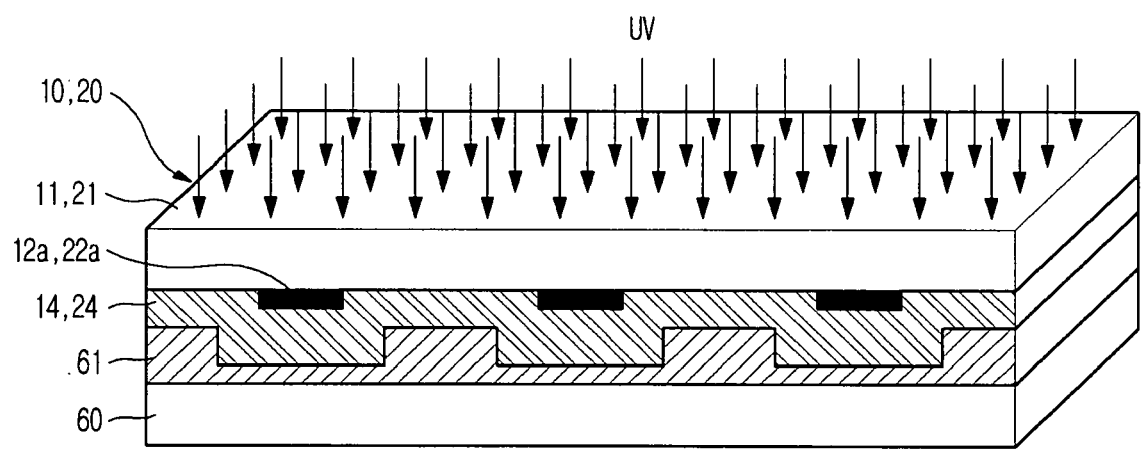

In FIG. 3C, the imprint resin 61 on the forming substrate 60 may be pressed with the one-step shaped first or second mold 10 or 20. The pressed imprint resin 61 may be irradiated with substantially parallel UV rays, wherein the UV rays reach the imprint resin 61 through the first or second substrate 11 or 21 of the first or second mold 10 or 20. Because of the UV barrier patterns 12a or 22a, portions of the imprint resin 61 will be shielded from the UV rays. As a result, only portions of the imprint resin 61 not shielded by the UV barrier patterns 12a or 22a are cured by the UV rays.

Figure 3D:
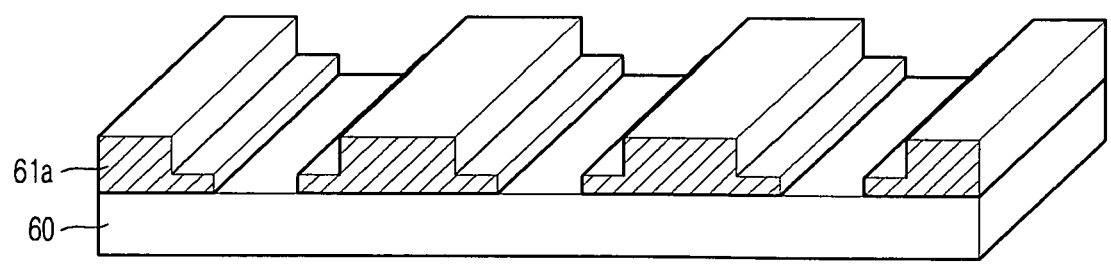

In FIG. 3D, the first or second mold 10 or 20 is separated from the imprint resin 61, and the uncured portions of the imprint resin 61 may be removed (e.g., washing with alcohol). As a result, a multi-step pattern 61a may be formed on the forming substrate 60.

Hereinafter, a method of forming a multi-step pattern through a nano imprint process using the above-discussed one-step shaped first or second mold 10 or 20 will be described.

Figure 4:
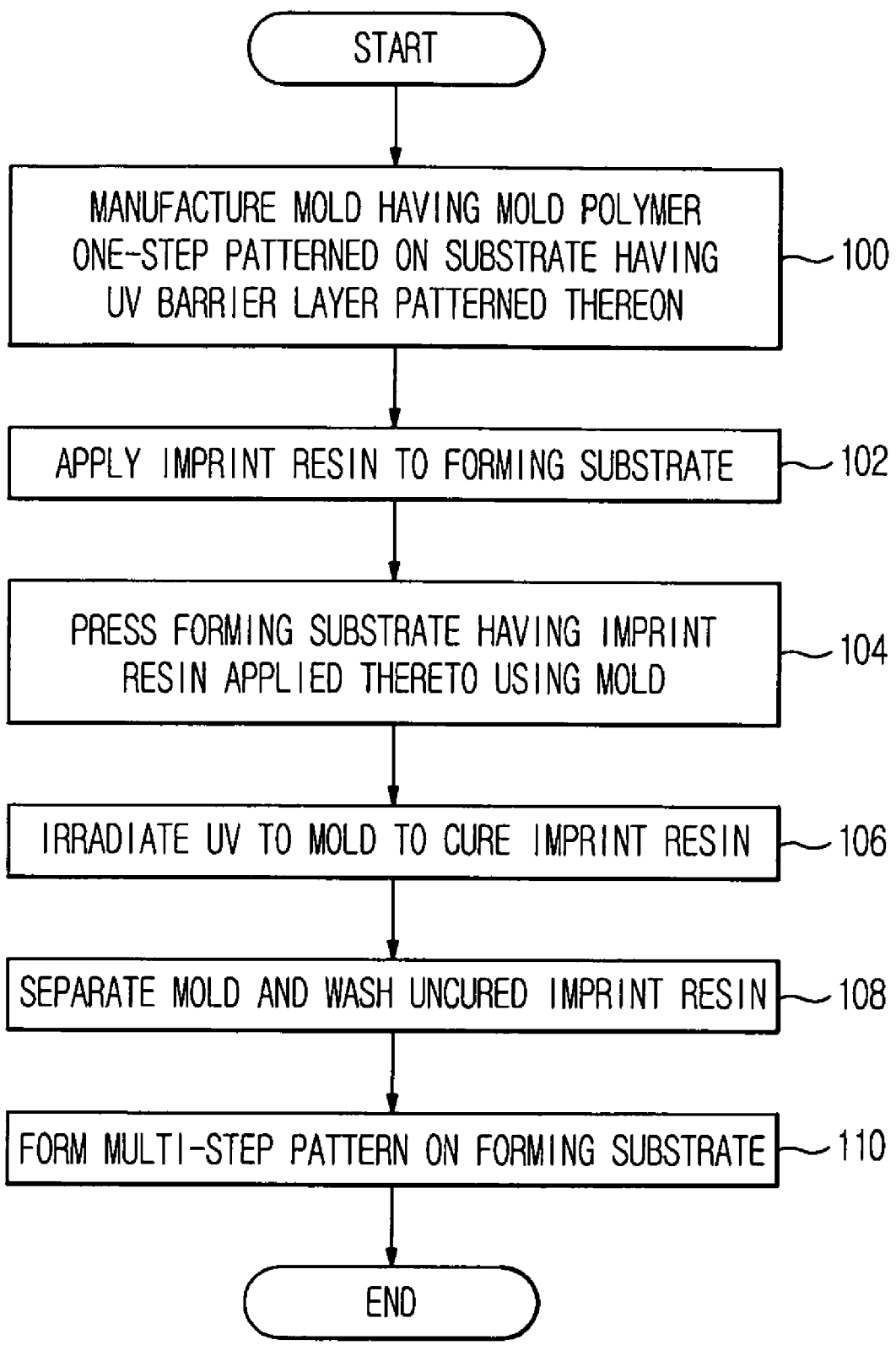
FIG. 4 is a flow chart illustrating a method of forming a multi-step pattern using a nano imprint process according to example embodiments.

FIG. 4 is a flow chart illustrating a method of forming a multi-step pattern using a nano imprint process according to example embodiments.

In step 100, a one-step shaped first or second mold 10 or 20 for use in multi-step imprinting may be manufactured according to example embodiments (e.g., FIGS. 1A to 1G and 2A to 2G). As also shown in FIG. 3A, the molding polymer 14 or 24 may be patterned in a one-step shape on the first or second substrate 11 or 21 having the UV barrier patterns 12a or 22a. Thus, the first or second mold 10 or 20 may be manufactured with greater ease for multi-step imprinting (which, conventionally, has been relatively difficult to achieve with a nano imprinting process).

In step 102, a UV-curable imprint resin 61 may be applied to a forming substrate 60.

In step 104, the imprint resin 61 on the forming substrate 60 may be pressed using the one-step shaped first or second mold 10 or 20.

In step 106, the pressed imprint resin 61 may be irradiated with substantially parallel UV rays, wherein the UV rays reach the imprint resin 61 through the first or second substrate 11 or 21 of the first or second mold 10 or 20 to cure the imprint resin 61. Because of the UV barrier patterns 12a or 22a in the first or second mold 10 or 20, portions of the imprint resin 61 will be shielded from the UV rays and, thus, will remain uncured.

In step 108, the first or second mold 10 or 20 is separated from the imprint resin 61, and the uncured portions of the imprint resin 61 may be removed (e.g., washed using alcohol).

In step 110, as a result of the preceding steps, a multi-step pattern 61a may be formed on the forming substrate 60. After the multi-step pattern 61a is formed on the forming substrate 60, the UV nano imprint process may be considered completed.

In view of the above description, a multi-step pattern may be formed with relative ease using the one-step shaped first or second mold for use in multi-step imprinting, thus avoiding the repetition of more complicated processes. Consequently, it may be possible to form a relatively large-area micro pattern, a relatively large-area pattern usable in flat panel displays, and a nano pattern having a size of several tens of nanometers in a semiconductor process, thereby contributing to the reduction of process costs, the reduction of process time, and the improvement of production yield.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of forming a pattern, comprising:
    patterning a molding polymer on a molding substrate having UV barrier patterns to attain a mold, wherein the molding polymer is patterned so as to have an embossed pattern on each of the UV barrier patterns, the embossed pattern having a width that is wider than that of the UV barrier patterns;
    applying an imprint resin onto a forming substrate;
    pressing the imprint resin with the mold;
    curing the pressed imprint resin; and
    separating the mold from the cured imprint resin.

2. The method according to claim 1, wherein the molding substrate is formed of a material that allows the transmission of UV rays through the molding substrate.

3. The method according to claim 2, wherein the molding substrate is formed of glass or quartz.

4. The method according to claim 1, wherein the UV barrier patterns are formed of a material that precludes the transmission of UV rays through the UV barrier patterns.

5. The method according to claim 4, wherein the UV barrier patterns are formed of chromium.

6. The method according to claim 1, wherein the molding polymer and the imprint resin are different materials.

7. The method according to claim 1, wherein the mold is coated with an anti-adhesion layer prior to pressing the imprint resin with the mold.

8. The method according to claim 1, wherein the imprint resin is UV-curable.

9. The method according to claim 1, wherein the cured imprint resin has a multi-step pattern.

10. The method according to claim 9, wherein the multi-step pattern includes a three-dimensional micro pattern.

11. The method according to claim 9, wherein the multi-step pattern includes a three-dimensional macro pattern.

12. The method according to claim 1, further comprising: washing away uncured imprint resin after separating the mold from the cured imprint resin.

13. The method according to claim 12, wherein the uncured imprint resin is washed away with alcohol.

14. The method of claim 1, wherein the UV barrier patterns are formed by patterning a UV barrier layer on the molding substrate.

15. The method according to claim 14, wherein the UV barrier patterns are formed with an exposure process.

16. The method according to claim 14, wherein patterning the UV barrier layer includes:
    applying a resist layer onto the UV barrier layer and forming a resist pattern; and
    etching the UV barrier layer using the resist pattern as a mask.

17. The method according to claim 14, wherein the molding polymer is patterned with an imprint process.

18. The method according to claim 14, wherein the molding polymer is patterned with an exposure process.

19. The method according to claim 14, wherein the molding polymer is UV-curable.

20. The method according to claim 14, wherein the molding polymer is heat-curable.

* * * * *